United States Patent
Ishitsuka et al.

(10) Patent No.: US 7,279,769 B2
(45) Date of Patent: Oct. 9, 2007

(54) SEMICONDUCTOR DEVICE AND MANUFACTURING METHOD THEREOF

(75) Inventors: Norio Ishitsuka, Kasumigaura (JP); Jun Tanaka, Kawasaki (JP); Tomio Iwasaki, Tsukuba (JP); Hiroyuki Ohta, Tsuchiura (JP)

(73) Assignee: Renesas Technology Corp., Tokyo (JP)

( * ) Notice: Subject to any disclaimer, the term of this patent is extended or adjusted under 35 U.S.C. 154(b) by 100 days.

(21) Appl. No.: 11/139,002

(22) Filed: May 25, 2005

(65) Prior Publication Data

US 2005/0269662 A1 Dec. 8, 2005

(30) Foreign Application Priority Data

May 25, 2004 (JP) ............... 2004-154226

(51) Int. Cl.
*H01L 29/00* (2006.01)
*H01L 21/76* (2006.01)

(52) U.S. Cl. ............. 257/510; 257/501; 257/515; 257/506; 257/513; 257/524; 438/221; 438/396; 438/253; 438/345; 438/219; 438/295; 438/355; 438/404

(58) Field of Classification Search ........... 257/501, 257/515, 510, 506, 513, 524; 438/221, 396, 438/253, 345, 219, 295, 355, 404
See application file for complete search history.

(56) References Cited

U.S. PATENT DOCUMENTS 5,739,580 A * 4/1998 Aronowitz et al. ......... 257/647
7,084,477 B2 * 8/2006 Ishitsuka et al. ........... 257/501

FOREIGN PATENT DOCUMENTS

| JP | 05-047918 | 2/1993 |
|---|---|---|
| JP | 05-114646 | 5/1993 |
| JP | 06-097274 | 4/1994 |
| JP | 08-097210 | 4/1996 |
| JP | 10-056058 | 2/1998 |
| JP | 11-186378 | 7/1999 |
| JP | 11-307626 | 11/1999 |
| JP | 2000-114362 | 4/2000 |
| JP | 2000-223572 | 8/2000 |
| JP | 2001-144170 | 5/2001 |
| JP | 2001-167411 | 6/2001 |
| JP | 2002-009245 | 1/2002 |
| JP | 2002-289681 | 10/2002 |
| JP | 2003-031568 | 1/2003 |
| JP | 2003-031650 | 1/2003 |

* cited by examiner

*Primary Examiner*—Kenneth Parker
*Assistant Examiner*—Joseph Nguyen
(74) *Attorney, Agent, or Firm*—Townsend and Townsend and Crew LLP

(57) ABSTRACT

To suppress occurrence of dislocation in a substrate of a semiconductor device at an end portion of a gate electrode. Provided is a semiconductor device having a plurality of element formation regions formed over the main surface of a semiconductor substrate, an element isolation trench located between the element formation regions and having an element isolation insulating film embedded therein, and a gate insulating film, a gate electrode and a plurality of interconnect layers formed thereabove, each formed in the element formation region, wherein the element isolation trench has a thermal oxide film formed between the semiconductor substrate and the element isolation insulating film, and the element isolation film has a great number of micro-pores formed inside thereof and is more porous than the thermal oxide film.

15 Claims, 6 Drawing Sheets

SEMICONDUCTOR DEVICE AND MANUFACTURING METHOD THEREOF

CLAIM OF PRIORITY

The present application claims priority from Japanese application serial JP 2004-154226 filed on May 25, 2004, the content of which is hereby incorporated by reference into this application.

FIELD OF THE INVENTION

The present invention relates to a semiconductor device and a manufacturing method thereof.

BACKGROUND OF THE INVENTION

An insulating film which is to be a sidewall is formed on the sidewalls of a gate electrode of an MOS transistor, and source and drain regions are formed by implanting an impurity into both sides of the gate electrode. At the end portions of these source and drain regions, however, many crystal defects appear in a silicon substrate. As a method of preventing these crystal defects, Japanese Patent Laid-Open No. H8(1996)-97210 (Patent Document 1) discloses a mode in which the influence of a stress caused by a nitride film formed on the side surface of a gate electrode is suppressed by forming an oxide film on the side surfaces of the gate electrode and between a silicon nitride film to be sidewalls and a substrate therebelow. [Patent Document 1] Japanese Patent Laid-Open No. H8(1996)-97210

SUMMARY OF THE INVENTION

As a result of investigation, the present inventors have found that crystal defects appearing in the active region of the substrate including source and drain regions deteriorate characteristics of a device. The present inventors have also found, as a result of investigation on measures to suppress these crystal defects, that a stress (STI stress) from element isolation (shallow trench isolation) greatly affects generation of crystal defects. In the above-described patent document, however, no consideration is paid for the STI stress.

An object of the present invention is to provide a semiconductor device and manufacturing method thereof capable of overcoming the above-described inconvenience.

With a view to overcoming the above-described problem, the semiconductor device of the present invention has a structure in which an external stress from an element isolation region is reduced, which makes it possible to suppress crystal defects which occur in a semiconductor substrate in the vicinity of a region into which impurities for source and drain have been implanted.

For example, the present invention is equipped with the following modes in order to overcome the above-described problem.

(1) A semiconductor device comprises a plurality of element formation regions which are formed over the main surface of a semiconductor substrate, an element isolation trench which lies between the element formation regions and has an element isolation insulating film buried in the trench, and a gate insulating film formed in the element formation regions, wherein the element isolation trench has a thermal oxide film formed between the semiconductor substrate and the element isolation insulating film, and the element isolation film is equipped with a large number of micro-pores inside thereof and is more porous than the thermal oxide film.

Even if diffusion layers such as source and drain have been formed by ion implantation, generation of crystal defects in the substrate can be suppressed by adopting the above-described constitution. Stress concentration due to growth of an oxide film on the sidewalls of the trench by oxidation of the trench can therefore be relaxed at least by making the element isolation insulating film more porous than the thermal oxide film (surface film of the trench).

In another aspect, it is also possible to form the element isolation insulating film buried in the element isolation trench and the gate insulating film as a film having silicon oxide as their main constituent element, and make the element isolation insulating film more porous than the gate insulating film.

It is also possible to manufacture the semiconductor device equipped with, in the element formation region, the gate insulating film, a gate electrode and a plurality of interconnect layers formed thereover, wherein the element isolation insulating film buried in the element isolation trench is made more porous than an interlayer insulating film existing between the undermost interconnect layer, among the interconnect layers, and the main surface of the semiconductor substrate.

In this aspect, over the interlayer insulating film, another interlayer insulating film which is more porous than it is preferably formed.

The element isolation film and the former interlayer insulating film preferably have silicon oxide as their main constituent element.

The term "main constituent element" as used herein means a material, among materials constituting a layer, which exists most abundantly in terms of an atomic ratio. The term "porous" means a state of a layer with many micro-pores formed therein.

The term "more porous than the thermal oxide film" means that when the thermal oxide film is equipped with the above-described micro-pores, the element isolation insulating film has more micro-pores than those of the thermal oxide film, while when the thermal oxide film is not equipped with the above-described micro-pores, the element isolation insulating film has the micro-pores.

(2) A semiconductor device comprises a plurality of element formation regions which are formed over the main surface of a semiconductor substrate, an element isolation trench which lies between the element formation regions and has an element isolation insulating film buried in the trench, and a gate insulating film, a gate electrode and a plurality of interconnect layers formed thereover, each formed in the element formation regions, wherein the element isolation trench has a thermal oxide film formed between the element isolation insulating film and the surface of the semiconductor substrate, a nitride film thinner than the thermal oxide film is formed or not formed between the element isolation insulating film and the thermal oxide film, and the element isolation insulating film is a porous film which has, inside thereof, a large number of micro-pores and in which the number of micro-pores with a pore diameter of 5 nm or less exceeds that of micro-pores with a pore diameter of 10 nm or greater after heating to the highest temperature among heating temperatures for the formation of the semiconductor device.

Scattering of large-sized micro-pores disturb improvement of mechanical and structural characteristics, so that the element isolation insulating film preferably has sufficiently small micro-pores. The diameter of the sufficiently small micro-pores is, for example, the above-described one.

The nitride film as described above is preferably omitted in consideration of the charge up caused by this nitride film.

The micro-pore is preferably adjusted to have an average micro-pore diameter falling within a range of from 1 nm or greater and less than 1.3 nm.

The Young's modulus of the element isolation insulating film is less than 70 GPa, more preferably 35 GPa or less after heating to the highest temperature among heating temperatures for the formation of the semiconductor device.

(3) A semiconductor device comprises a plurality of element formation regions which are formed over the main surface of a semiconductor substrate, an element isolation trench which lies between the element formation regions and has an element isolation insulating film buried in the trench, and a gate insulating film, a gate electrode and a plurality of interconnect layers formed thereover, each formed in the element formation regions, wherein the element isolation trench has a thermal oxide film formed between the semiconductor substrate and the element isolation insulating film, and the element isolation insulating film has a Young's modulus lower than that of the thermal oxide film.

More specifically, it is preferred that after heating to the highest temperature among heating temperatures for the formation of the semiconductor device, the element isolation insulating film buried in the element isolation trench is porous with micro-pores having a diameter of 5 nm or less exceeding those having a diameter of 10 nm or greater and has a Young's modulus less than 70 GPa, more preferably not greater than 35 GPa.

In another aspect, the element isolation insulating film buried in the element isolation trench and the gate insulating film has silicon oxide as a main constituent element and the element isolation insulating film has a lower Young's modulus than that of the gate insulating film.

(4) A semiconductor device comprises a plurality of element formation regions formed over the main surface of a semiconductor substrate, an element isolation trench which lies between the element formation regions and has an element isolation insulating film buried in the trench, and a gate insulating film, agate electrode and a plurality of interconnect layers formed thereover, each formed in the element formation regions, wherein the element isolation insulating film has a first element isolation insulating film deposited over the element isolation trench having a thermal oxide film formed over the surface of the substrate, and a second element isolation insulating film deposited over the first element isolation insulating film, the first element isolation insulating film is porous and more porous than the second element isolation insulating film.

One preferred example is a semiconductor device in which the first element isolation film has any one of the above-described porous structures with micro-pores, while the second element isolation film is substantially free from such a porous structure.

Another preferred example is a semiconductor device in which the first element isolation insulating film and the second element isolation insulating film each has silicon oxide as a main constituent element and the first element isolation insulating film contains carbon as an added element.

A more preferred example among the above-described semiconductor devices is a semiconductor device in which the element isolation trench has a thermal oxide film formed between the semiconductor substrate and the first element isolation insulating film and the first element isolation film is more porous than the thermal oxide film.

A more preferred example among the above-described semiconductor devices is a semiconductor device in which the element isolation trench has a thermal oxide film formed between the semiconductor substrate and the first element isolation insulating film and the first element isolation film has a lower Young's modulus than the thermal oxide film.

(5) In any one of the above-described semiconductor devices, the element formation region has an impurity region obtained by implanting an impurity into the semiconductor substrate relative to the gate electrode; and the interfaces of the second element isolation insulating film on the side of the interlayer insulating film and on the side of the first element isolation film exist in a region deeper than the depth which is below the surface of the substrate in the impurity region and at which an impurity concentration becomes highest.

In this semiconductor device, the surface of a buried oxide film in the element isolation region is made lower than the substrate surface in the element formation region, which makes it possible to effectively suppress the generation of crystal defects.

(6) A manufacturing method of a semiconductor device comprises the steps of:

forming a pad oxide film on the circuit formation surface of a semiconductor substrate and forming an antioxidant film over the pad oxide film;

removing the antioxidant film and pad oxide film formed at desired positions on the circuit formation surface of the semiconductor substrate to form a trench of a predetermined depth in the region from which the films have been removed;

oxidizing the trench to form a thermal oxide film therein;

burying an element isolation insulating film in the trench equipped with the thermal oxide film;

removing the element isolation insulating film formed over the antioxidant film and removing the antioxidant film formed over the circuit formation surface of the semiconductor substrate;

removing the pad oxide film formed over the circuit formation surface of the semiconductor substrate;

forming a gate insulating film and a gate electrode on the circuit formation surface of the semiconductor substrate from which the pad oxide film has been removed;

implanting an impurity into the semiconductor substrate relative to the gate electrode and heat-treating the semiconductor substrate having the implanted impurity therein to form a diffusion layer;

depositing an interlayer insulating film having an upper surface at a position above the upper end of the gate electrode, while covering the gate insulating film and the element isolation trench, and forming an interconnect layer over the interlayer insulating film; wherein:

the semiconductor substrate is heat-treated at 850° C. or greater after the formation of the element isolation insulating film, and the element isolation insulating film after the heat treatment step is equipped with a large number of micro-pores and is more porous than the thermal oxide film in the trench.

A film equipped with micro-pores is heat-treated at 850° C. or greater, preferably at 1000° C. or greater to form a silicon oxide film equipped, in a desirable state, with micro-pores from which carbon components have been removed. After heat treatment, the micro-pores may contain carbon components.

In the above-described modes, the element isolation insulating film is preferably made of an oxide film. When the semiconductor device has a first element isolation film and a second element isolation film, they are preferably an oxide film. Or, the element isolation insulating film is preferably a film formed by the method of application.

As a result of research of known examples on the technology of the present invention, the present inventors have found the below-described prior arts. There exist no inventions equipped with the above-described modes and capable of exhibiting effects and advantages of the present invention. Japanese Patent Laid-Open No. H11(1999)-307626, Japanese Patent Laid-Open No. H11(1999)-186378, Japanese Patent Laid-Open No. 2003-31650, Japanese Patent Laid-Open No. 2003-31568, Japanese Patent Laid-Open No. 2000-114362, Japanese Patent Laid-Open No. H6(1994)-97274, Japanese Patent Laid-Open No. H5(1993)-47918, Japanese Patent Laid-Open No. H5(1993)-114646, Japanese Patent Laid-Open No. H10(1998)-56058, Japanese Patent Laid-Open No. 2000-223572, Japanese Patent Laid-Open No. 2001-144170, Japanese Patent Laid-Open No. 2001-167411, Japanese Patent Laid-Open No. 2002-9245, Japanese Patent Laid-Open No. 2002-289681

According to the present invention, a semiconductor device and a manufacturing method thereof capable of contributing to elimination of the above-described inconvenience can be provided.

DETAILED DESCRIPTION OF THE PREFERRED EMBODIMENTS

The present inventors have investigated on the crystal defect formation tendency in the case where an impurity such as arsenic or phosphorus is implanted into a silicon substrate at a high concentration when an element isolation region has been formed over a substrate and a gate structure has been formed in an element formation region. As a result, it has been found that when an impurity is implanted into a substrate, a high stress (impurity-induced stress) appears in a region (impurity formation region) in which an impurity has been implanted and this impurity-induced stress is restrained by a stress (STI stress) occurring during the formation of a gate structure or element isolation, leading to formation of crystal defects. The present inventors therefore considered that crystal defects can be prevented by reducing a stress, which occurs during formation of an element isolation region, in order to prevent the restraint of this impurity-induced stress.

The element isolation is obtained by forming a trench in a silicon substrate and filling the trench with a buried oxide film. A transistor formation process includes many oxidizing steps of a silicon substrate. Oxygen which will be an oxidizing species is diffused also into the trench through the buried oxide film so that the oxide film grows on the sidewalls of the trench. When Si is converted into $SiO_2$, about twice volume expansion occurs. This volume expansion is restrained by the buried oxide film so that a high compression stress occurs in the silicon substrate. In order to reduce this compression stress, a porous oxide film having a lower Young's modulus than a thermal oxide film or CVD oxide film is used as the buried oxide film.

The method of the present invention does not require deposition of a thick silicon oxide film below a silicon nitride film so that dislocation can be prevented.

As described above, a semiconductor device and a manufacturing method thereof capable of contributing to elimination of the above-described inconvenience can be provided by the present invention. Since defects which occur in the source and drain regions of the substrate can be suppressed, a semiconductor device having a good performance and a manufacturing method of it can be provided.

Manufacturing steps of a semiconductor device according to a first embodiment of the present invention will next be described referring to FIGS. 1 to 2J.

Figure 1:
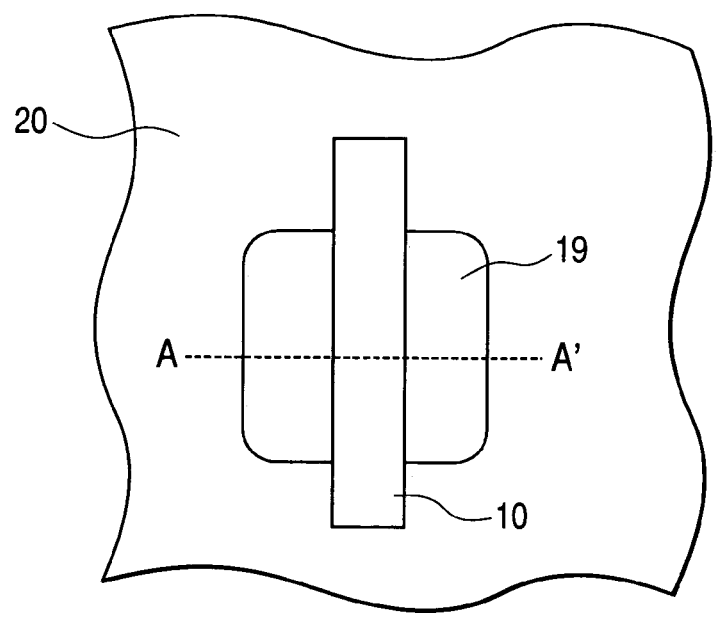
FIG. 1 is schematic view of a first embodiment of the present invention.

FIG. 1 is a plan layout view and FIG. 2 is across-sectional view of the structure taken along a line A-A' of FIG. 1.

Figure 2A:
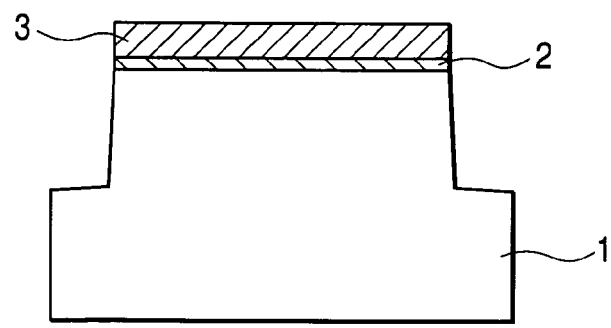
FIG. 2A is a schematic view illustrating a manufacturing step in the first embodiment of the present invention.

(1) A pad oxide film 2 having a thickness of from 5 to 15 nm and a silicon nitride film 3 having a thickness of about 150 nm are deposited over a silicon substrate 1. Desired portions of the silicon nitride film 3, pad oxide film 2 and silicon substrate 1 are partly removed by etching, whereby shallow trenches each having a predetermined angle between the silicon substrate 1 and surface sidewall of the silicon substrate 1 are formed (FIG. 2A).

Figure 2B:
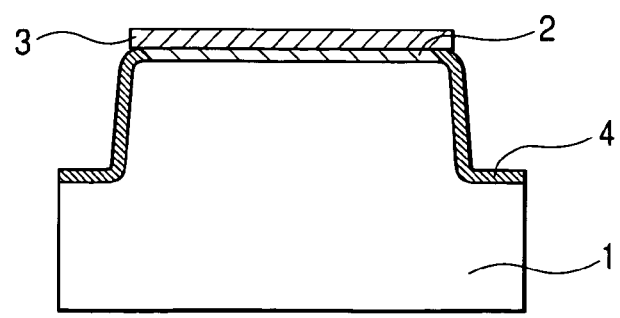
FIG. 2B is a schematic view illustrating the subsequent manufacturing step in the first embodiment of the present invention.

(2) The surface of the silicon substrate 1 is thermally oxidized in an oxidizing atmosphere at a temperature range of from 900 to 1150° C. to form an element isolation thermal oxide film 4 having a thickness of several nm to several tens nm in the trenches (FIG. 2B). The trenches are each embedded with an oxide film having a Young's modulus less than 70 GPa (which will hereinafter be called "buried insulating film 5). It is, for example, an insulating film composed mainly of SiO, which film is available by heating a coating film having a hydrogen silsesquioxane compound as a main component. Alternatively, it is for example an insulating film composed mainly of SiO, which film is available by heating a coating film having a methyl silsesquioxane compound as a main component.

Figure 2C:
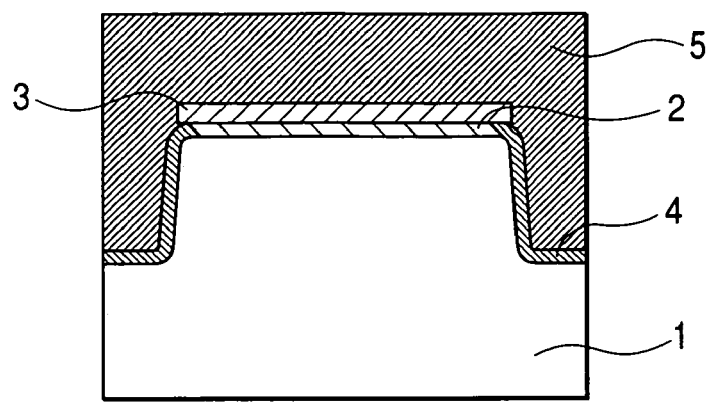
FIG. 2C is a schematic view illustrating the subsequent manufacturing step in the first embodiment of the present invention.

The silicon substrate 1 is then annealed in a nitrogen or oxidizing atmosphere at a temperature range of from 900 to 1150° C. (FIG. 2C).

Figure 2D:
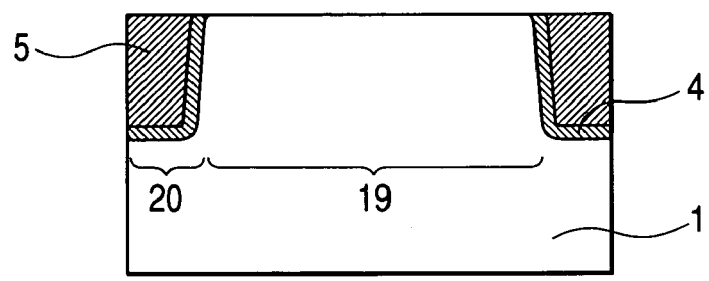
FIG. 2D is a schematic view illustrating the subsequent manufacturing step in the first embodiment of the present invention.

(3) The buried insulating film 5 having a low Young's modulus is etched back by chemical mechanical polishing (CMP) or dry etching. In this case, the silicon nitride film 3 used as an antioxidant film serves as an etching stopper and serves to prevent etching of the silicon substrate 1 below the silicon nitride film 3. After the etch back until exposure of the silicon nitride film 3, the silicon nitride film 3 and pad oxide film 2 are removed, whereby a shallow-trench type element isolation structure having an oxide film embedded in the shallow trench is completed (FIG. 2D). The region from which the Si substrate is exposed becomes an element formation region 19, while the trench region becomes an element isolation region (STI region) 20.

Figure 2E:
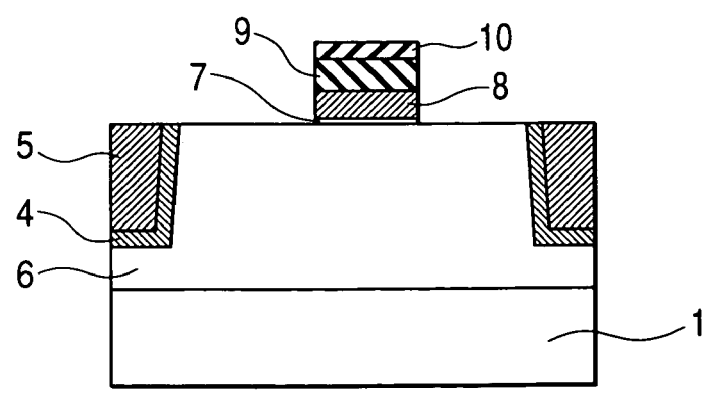
FIG. 2E is a schematic view illustrating the subsequent manufacturing step in the first embodiment of the present invention.

(4) A thermal oxide film of about 10 nm thick is formed by heat-treating the surface of the silicon substrate 1 at 900° C. in an oxygen atmosphere, followed by implantation of an impurity such as boron or phosphorus at a concentration of 1E13 (atoms/cm$^2$) with the thermal oxide film as a buffer layer, whereby a well layer 6 is formed. A gate electrode is then formed by removing the thermal oxide film by using diluted HF, and successively depositing and patterning a gate oxide film 7, a polycrystalline silicon film 8, a tungsten film 9 and a silicon nitride film 10 (FIG. 2E).

Figure 2F:
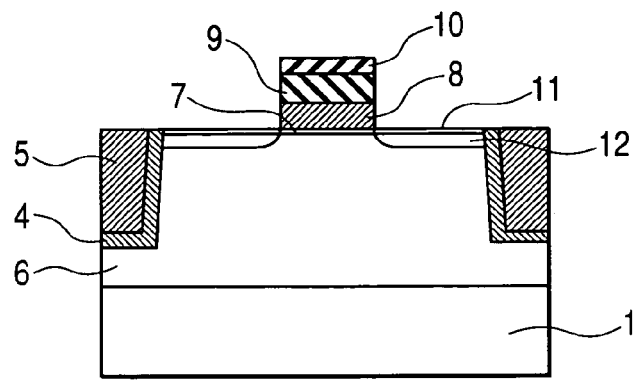
FIG. 2F is a schematic view illustrating the subsequent manufacturing step in the first embodiment of the present invention.

(5) A thermal oxide film 11 of from 3 to 10 nm thick is formed over the surface of the silicon substrate 1 by heat treatment at 900° C. in an oxygen atmosphere. With the resulting film as a buffer layer, boron (in the case of PMOS) or arsenic (in the case of NMOS) is implanted into the silicon substrate 1 at a concentration of about 1E13 (atoms/cm$^2$) to form a low-doped layer 12 (FIG. 2F).

Figure 2G:
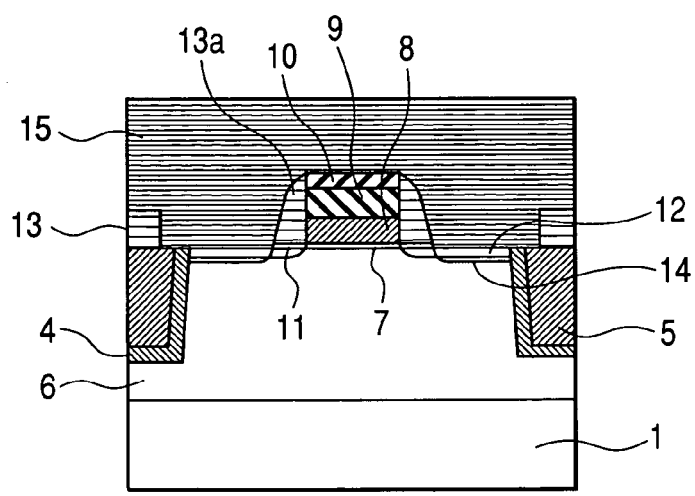
FIG. 2G is a schematic view illustrating the subsequent manufacturing step in the first embodiment of the present invention.

(6) After deposition of a silicon nitride film 13 serving as an insulating film, it is patterned to form a sidewall 13a. Boron (in the case of PMOS) or arsenic (in the case of NMOS) is implanted into the exposed silicon substrate 1 at a concentration of from about 5E14 to 3E15 (atoms/cm$^2$) to form a highly doped layer 14. An interlayer insulating film 15 is deposited all over the surface of the substrate by chemical vapor deposition, followed by planarization of it by CMP or the like (FIG. 2G).

Figure 2H:
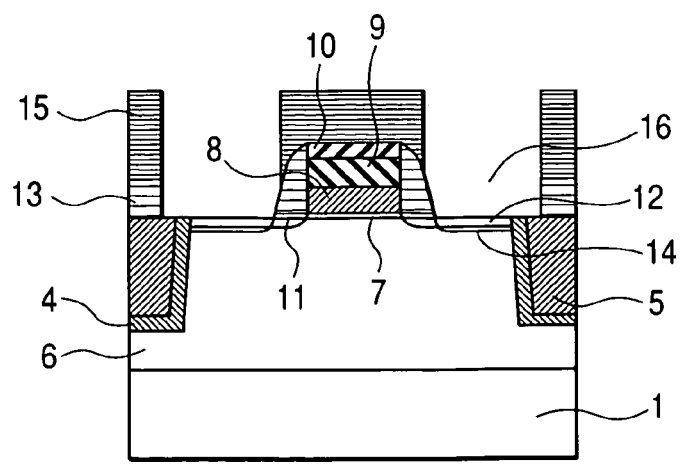
FIG. 2H is a schematic view illustrating the subsequent manufacturing step in the first embodiment of the present invention.

(7) A portion of the interlayer insulating film 15 is removed by anisotropic dry etching to form a contact region 16 (FIG. 2H).

Figure 2I:
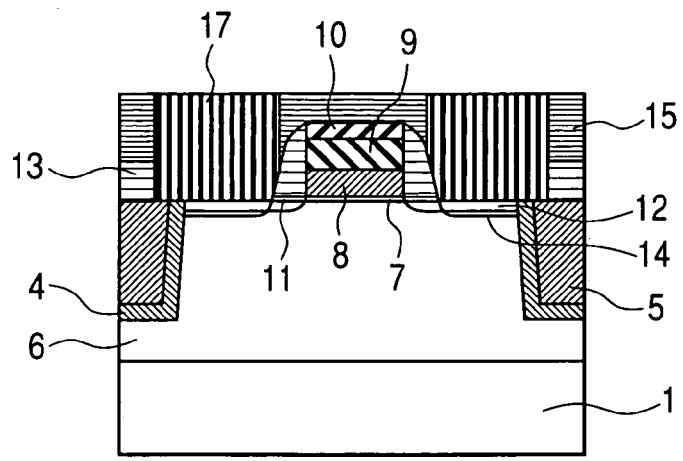
FIG. 2I is a schematic view illustrating the subsequent manufacturing step in the first embodiment of the present invention.
Figure 2J:
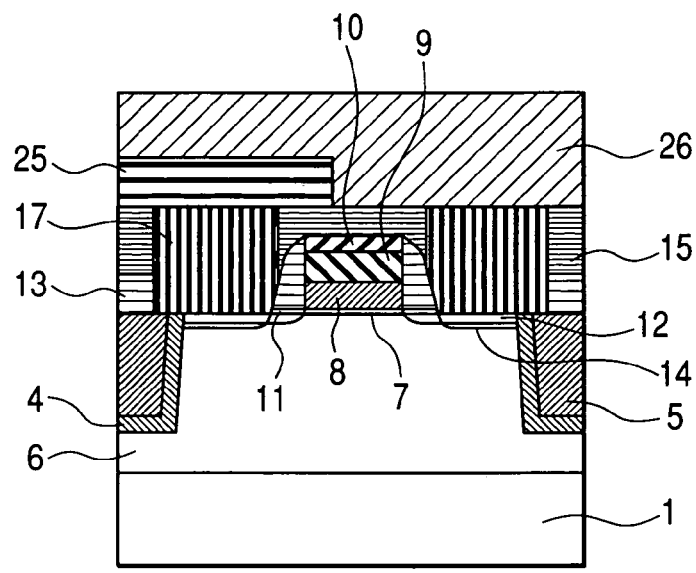
FIG. 2J is a schematic view illustrating the subsequent manufacturing step in the first embodiment of the present invention.

(8) For electrode extraction from the silicon substrate 1, a polycrystalline silicon film 17 serving as an electrode plug is deposited over the contact region 16 (FIG. 2I).

(9) After deposition, over the contact region, and patterning of a conductive film 25 made of copper or aluminum, an interlayer insulating film 26 is deposited thereover, whereby a transistor is completed. It is to be noted that another metal such as tungsten may be used as a material for the electrode plug because any material is usable for the electrode plug insofar as it has low electrical resistance.

Figure 3:
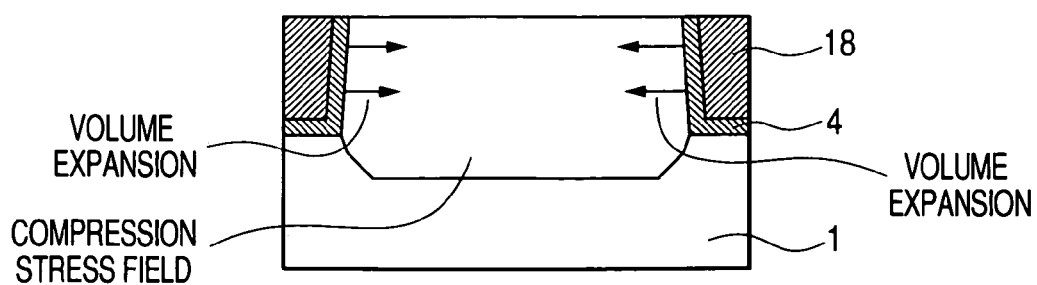
FIG. 3 is a supplement explanatory view of the first embodiment of the present invention.

Effects and advantages of this embodiment will next be described. It is empirically known that many crystal defects are apt to appear in the case where an impurity such as arsenic or phosphorus is implanted into a silicon substrate at a high concentration when an element isolation region is formed over the substrate and a gate structure is formed in an element formation region. Implantation of an impurity into a silicon substrate makes the surface of the silicon substrate amorphous by the atoms thus implanted. By the subsequent heat treatment, the amorphous layer crystallizes according to the atomic arrangement of the underlying silicon substrate. Crystal defects are considered to appear when this crystal arrangement is disturbed by the action of an external force (stress) during crystallization. In short, an external stress is thought to induce crystal defects. Recrystallization advances smoothly if the external stress is decreased, which leads to a reduction in crystal defects. The main external stress includes, in addition to the stress of a gate electrode, an STI stress. This STI stress has a mechanism as will be described below (refer to FIG. 3), and the stress sometimes reaches several hundreds MPa. The transistor formation process includes many oxidizing steps of a silicon substrate. Oxygen serving as an oxidizing species diffuses through a buried oxide film 18 inside of the trench and the oxide film grows also on the sidewalls of the trench. During conversion from Si into the oxide film (SiO$_2$), about twice volume expansion occurs and this volume expansion is restrained by the buried oxide film 18. Affected by the reaction force against this restraint, high compression stress occurs in the silicon substrate. This compression stress is called STI stress.

The STI stress occurs when the volume expansion during oxidation is restrained by the buried oxide film 18. The STI stress can be reduced if the buried oxide film 18 can be softened. Conventionally used SiO$_2$ films such as CVD oxide film (O3-TEOS film) and HDP film have a Young's modulus (after annealing at about 1000° C.) of at least 70 GPa. In the present invention, on the other hand, an oxide film having a reduced Young's modulus (that is, softened) compared with the above-described films is used. This decreases the STI stress, leading to a reduction in crystal defects.

In the semiconductor manufacturing steps, heat treatment at about 1000° C. is conducted during film deposition or activation of an impurity (for example, formation of source and drain, densification by heat treatment after STI deposition, or the like). The buried insulating film 5 must keep a low Young' modulus (less than 70 GPa) even after this heat treatment. An insulating film composed mainly of SiO available by heating of a coating film having a hydrogen silsesquioxane compound or methyl silsesquioxane compound as a main component, for example, is used in order to keep a low Young' modulus even after high-temperature heat treatment.

A coating solution having a hydrogen silsesquioxane compound as a main component is obtained by dissolving a compound represented by the formula (HSiO$_{1.5}$)$_n$ in a solvent such as methyl isobutyl ketone. A coating solution having a methyl silsesquioxane compound as a main component is obtained by dissolving a compound represented by the formula (CH$_3$SiO$_{1.5}$)$_n$ in a solvent such as methyl isobutyl ketone. After application of such a solution to a substrate, intermediate heating is performed preferably at a temperature of from about 100 to 250° C., followed by main heating at from 350 to 550° C. in an oxygen atmosphere, preferably in an inert atmosphere such as nitrogen atmosphere, whereby a ladder structure of Si—O—Si bonds is formed and an insulating film composed mainly of SiO is finally formed.

Micro-pores exist in the insulating film composed mainly of SiO available by heating a coating film having a hydrogen silsesquioxane compound or methyl silsesquioxane compound as a main component, and a reduction in Young's modulus can be attained by their existence.

When a component other than a solvent such as methyl isobutyl ketone is incorporated in a solution of, for example, a silsesquioxane compound, the decomposition site of this component in the film remains as a micro-pore. By changing the decomposition behavior depending on a film forming temperature, the micro-pore diameter can be controlled and adjusted to fall within a selected range.

The film thus formed has a Young's modulus of 35 GPa or less even after annealing at 1000° C. for 60 minutes and is therefore especially effective.

The strength can therefore be maintained after heat treatment at the highest temperature among heating temperatures during the formation process. The highest temperature heat treatment step is, for example, heat treatment for the formation of a gate oxide film or that for densification of STI. Treatment at, for example, at least 850° C. is performed in the highest temperature heat treatment step. More preferably, a semiconductor device formed by treatment at 1000° C. or greater is assumed. Or, the heat treatment temperature after formation of an element isolation insulating film in which a methyl group exists is preferably a temperature causing a change of the methyl group.

These characteristics can be analyzed, for example, by an indentation measuring method.

An average micro-pore diameter of the buried oxide film 5 thus prepared, which is an element isolation insulating film, is adjusted to fall within a range of from 1 nm or greater and less than 1.3 nm after annealing at from 900 to 1150° C.

Figure 4:
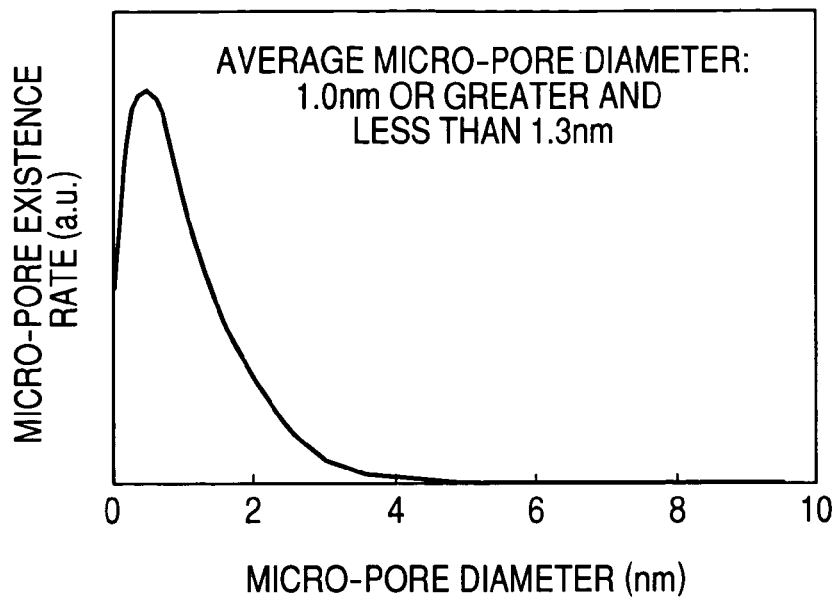
FIG. 4 is an explanatory view of the first embodiment of the present invention.

FIG. 4 shows the micro-pore diameter distribution of the micro-pores, which have been made by the method disclosed in this example, determined by measuring the micro-pore diameter and micro-pore existence rate in accordance with the X-ray diffuse scattering method. For example, it can be determined by comparing, with the X-ray diffusion measurement data and X-ray reflection measurement data, the theoretical scattering intensity using a scatter function of a supposed spherical scatterer, and calculating the micro-pore diameter distribution of the scatterer.

The micro-pore diameter at the distribution peak was about 0.5 nm. The maximum micro-pore diameter was 5 nm. The micro-pore diameter distribution is desirable, not with a great number of micro-pores having a large micro-pore diameter (for example, 10 μm or greater) but with a great number of micro-pores as minute as 5 nm or less. In addition, the maximum micro-pore diameter distribution as determined by X-ray scattering is adjusted to fall within a range of from 0.4 nm to 5 nm. The average micro-pore diameter falls within a range of 1 nm or greater and less than 1.3 nm. The micro-pore diameter within this range can prevent excessive increase of Young's modulus which will otherwise occur by excessive decrease of the micro-pore diameter, while it can prevent a reduction in the mechanical strength or breakdown voltage of an insulating film which will otherwise occur by excessive increase of the micro-pore diameter. Such a micro-pore diameter is therefore preferred from the viewpoint of effective improvement of the characteristics of a semiconductor device.

Such an element isolation insulating film can be made more porous than the undermost interlayer insulating film 15 composed mainly of $SiO_2$.

The element isolation insulating film can also be made more porous than the element isolation thermal oxide film 4 formed on the surface of the trench or the gate oxide film 7. It can be made more porous than such thermal oxide films.

Alternatively, the element isolation insulating film can be adjusted to have a lower Young's modulus than the element isolation thermal oxide film 4, or that of the undermost interlayer insulating film.

Examples of the method of applying the above-described insulating-film forming solution include spin coating, slit coating and printing. The insulating film is formed by heating the coating film so that even if minute trenches are formed with a high density, it can eliminate a surface step difference with good coverage. The insulating film formed by the method of application is therefore advantageous over an insulating film formed by CVD.

When CVD is adopted for the formation of an insulating film for a Si wafer having a large diameter, a large-sized film forming apparatus is required and an equipment cost has a great influence on a device cost. On the contrary, an insulating film is formed by the above-described method of application and heating in the present invention, which enables a drastic reduction in the equipment cost. A great effect for reducing an investment cost of a manufacturing line and moreover, a device cost can therefore be expected.

When formation of an insulating film by CVD is aimed at, an insulating film composed mainly of SiO can be formed finally by the ECR (Electron Cyclotron Resonance) plasma CVD (Chemical Vapor Deposition) method using a source gas composed mainly of an alkylsilane compound or alkoxysilane compound. Examples of the alkylsilane compound include trimethylsilane and tetramethylsilane, while those of the alkoxysilane compound include methoxysilane and ethoxysilane.

Also in this case, the diameter of micro-pores existing in the insulating film can be controlled, for example, by incorporating in a source gas a component having a high thermal decomposition temperature and leaving, as a micro-pore, a trace of decomposition of this component in the film during film formation by heating at a temperature from 350 to 450° C.

When such a method is adopted, the decomposition behavior can be changed, depending on the thermal decomposition temperature of a component selected. By controlling the micro-pore formation by using this method, the average micro-pore diameter can be adjusted to fall within a selected range.

The interlayer insulating film 15 is prepared using chemical vapor deposition (CVD). A coating film composed mainly of a hydrogen silsesquioxane compound or methyl silsesquioxane compound can be used instead. This film is also usable as an interlayer insulating film between interconnects. As the interlayer insulating film, silicon oxide or the like can be employed.

The film as described in this embodiment is sometimes greater in an etching rate by HF than a thermal oxide film.

Figure 5:
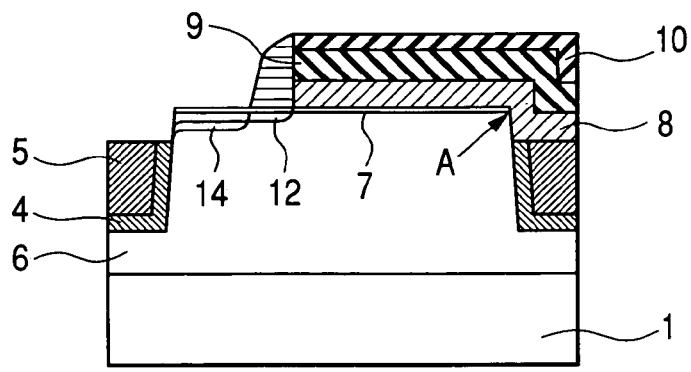
FIG. 5 is a comparative explanatory view of a second embodiment of the present invention.
Figure 6:
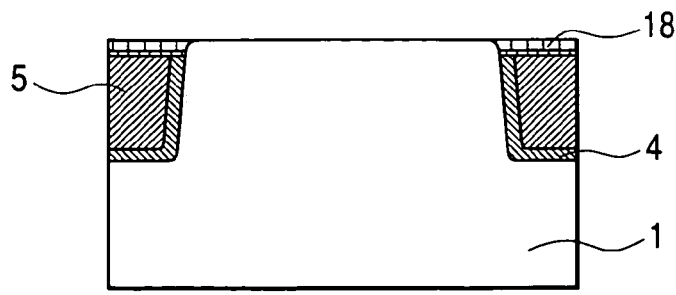
FIG. 6 is an explanatory view of the second embodiment of the present invention.

The second embodiment of the present invention will next be described referring to FIGS. 5 and 6. The constitution of the device according to the second embodiment is basically similar to that of the first embodiment. In the second embodiment, during the step as illustrated in FIG. 5 which is an explanatory view of the second embodiment, the surface of the buried oxide film 5 drops relative to the surface of the silicon substrate at Position A and the polycrystalline silicon film 8, which is a gate electrode material, is formed in this recessed portion, which sometimes cause deterioration in electrical properties. After deposition of the insulating film 5 in FIG. 2C, the buried oxide film 5 having a low Young's modulus is etched back as illustrated in FIG.

6 toward a position below the surface of the substrate 1 in the element formation region. Over the surface of this buried oxide film 5, an upper buried oxide film 18 (for example, an HDP film or $O_3$-TEOS film which is substantially similar to the thermal oxide film) having higher HF resistance than the buried oxide film 5 is formed by CVD and it is filled in an upper end portion of the trench.

The buried oxide film 5 has a lower Young's modulus than the upper buried oxide film 18. In addition, the buried oxide film 5 is more porous than the upper buried oxide film 18.

The HDP or $O_3$-TEOS film is preferably as thin as possible, because the thicker such a film, the greater the stress at the upper end portion of the STI trench. For example, its thickness is preferably 50 nm or less, more preferably 30 nm or less.

Examples of the method of reducing the STI stress include a method of heat-treating in a NO gas the thermal oxide film 2, which has been formed in the step (1), and forming an oxynitride on the interface between the silicon substrate and the thermal oxide film 2; a method of forming an oxynitride on the surface of the thermal oxide film 2 by exposure to a nitrogen plasma; and a method of forming a gate electrode and forming STI. In these methods, the STI stress is reduced by suppressing diffusion of oxygen or reducing an oxidation amount. They are however not able to completely reduce the STI stress to zero so that the method according to the second embodiment is also effective when used in combination with the above-described method. In other words, the method of the second embodiment is effective as far as a stress due to STI exists.

Figure 7:
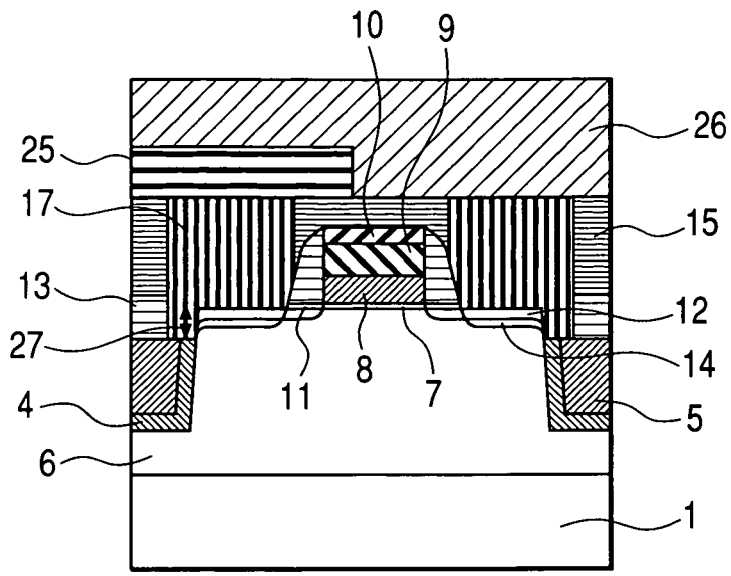
FIG. 7 is an explanatory view of a third embodiment of the present invention.
Figure 8:
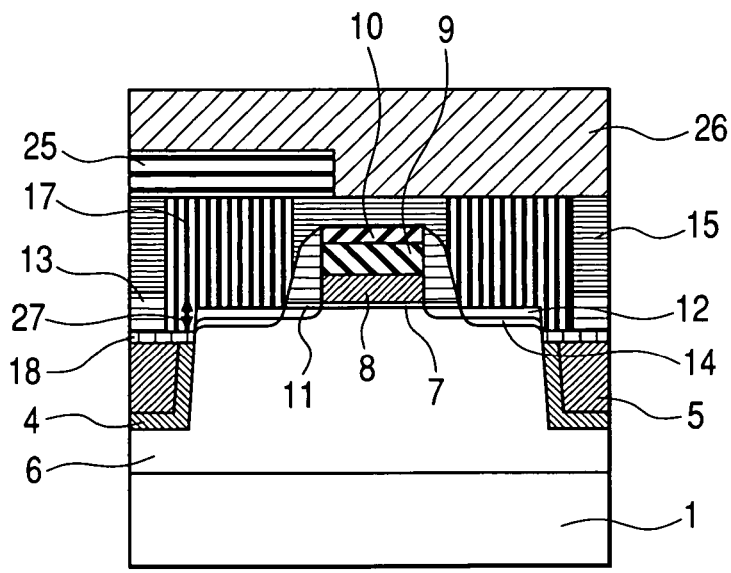
FIG. 8 is an explanatory view of the third embodiment of the present invention.

FIGS. 7 and 8 illustrate a third embodiment of the present invention.

A semiconductor device according to the third embodiment is principally similar to that of the second embodiment. The device of the third embodiment has, in the element formation region, an impurity region obtained by implanting an impurity into the semiconductor substrate relative to the gate electrode and the interface of the second element isolation insulating film on the side of the interlayer insulating film 15 and on the side of the first element isolation film are formed in a region deeper than the depth which is below the surface of the substrate in the impurity region and at which an impurity concentration becomes highest. The first element isolation insulating film has a surface, on the side of the interlayer insulating film, formed in a region deeper the above-described region.

More specifically, the surface (FIG. 7) of the buried insulating film 5 on the side of the interlayer insulating film 15 or, when an upper buried insulating film 18 exists, the surface (FIG. 8) of this film on the side of the interlayer insulating film 15 lies below the surface of the substrate. Since the flatness is sometimes low at the end portions of the element isolation insulating film, a height level in a flat region at the center of the element isolation insulating film is compared. In this embodiment, the buried oxide film in the element isolation region is laid below the surface of the substrate in the element formation region (27), which makes it possible to effectively suppress the generation of crystal defects in the substrate.

Deterioration of the characteristics can be suppressed effectively by taking a measure against crystal defects formed by a high stress (impurity-induced stress) appearing in a region (impurity formation region) to which an impurity has been implanted; and at the same time, by suppressing a high compression stress in the silicon substrate owing to volume expansion when Si constituting the semiconductor substrate is converted into $SiO_2$ with diffusion of oxygen, which is to be an oxidizing species, inside of the trench during many silicon substrate oxidation steps for the transistor formation.

The following are more specific embodiments of it.

Referring to FIG. 1 corresponding to FIGS. 7 and 8, in this embodiment, the element isolation region includes a region wherein a first end surface on the upper side of the buried insulating film in a first element isolation region in which a gate electrode exists is located above a second end surface of the buried insulating film in a second element isolation region in which no gate electrode film exists.

The second element isolation region in which no gate electrode exists may be a region existing at the periphery of the first element isolation region. The end surface of the insulating film which is measured as the second element isolation region can be measured in a region separated by the depth of the trench from the end portion of the element isolation region on the side of the trench. When it is difficult to define the measurement region, measurement may be made in a region including the center of the element isolation region sandwiched between active regions (for example, when a portion lower than the element isolation region is formed at the end portion of the element isolation region on the side of the substrate, this region is omitted from the measurement region).

For example, the first interface is, among the interfaces of the buried insulating film, an interface in a region opposite to the gate electrode existing thereabove. For example, the second interface is, among the interfaces of the buried insulating film, an interface in a region opposite to the interlayer insulating film formed thereabove.

In this embodiment, a difference between the first end surface and the second end surface may be thicker than the gate insulating film.

Figure 9:
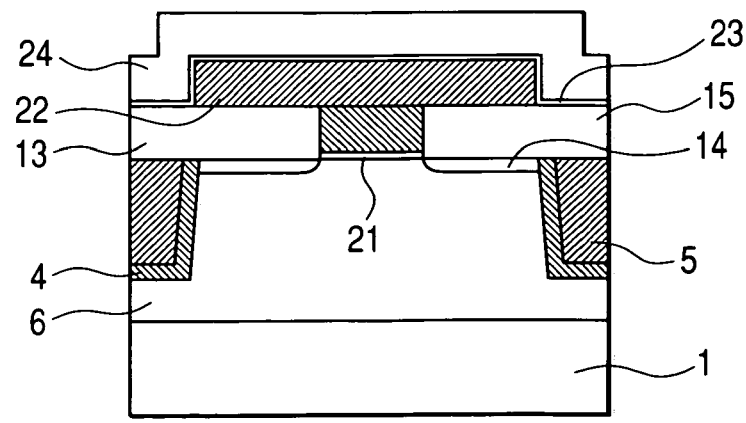
FIG. 9 is an explanatory view of a fourth embodiment of the present invention.

A fourth embodiment of the present invention is illustrated in FIG. 9. As illustrated in FIG. 9, this embodiment is principally similar to the first embodiment or the like except for the constitution of the electrode and thereabove. A conductive film 22 of a floating gate is formed over a gate insulating film 21 and over it, a gate insulating film 23 and a conductive film 24 of a control gate are formed. An interlayer insulating film is formed over the electrode, followed by the formation of an interconnect layer over the interlayer insulating film.

A flash memory having many oxidation steps and therefore having a large oxidation amount has a great STI stress (refer to FIG. 9) so that this method is especially effective for this flash memory.

According to a test made by the present inventors, the STI stress shows a drastic increase and crystal defects tend to appear at an STI width (trench width) of 0.2 µm or less. The present technology is therefore especially effective for devices having an STI width of 0.2 µm or less.

Moreover, a region having a narrow STI width can be embedded with a film by the method of application, compared with an oxide film by CVD. When CVD is employed, characteristics of a buried oxide film deteriorate at a STI width of 0.12 µm or less. The buried insulating film by the method of application is especially effective for devices having a STI width of 0.12 µm or less.

What is claimed is:

1. A semiconductor device comprising:
 a plurality of element formation regions formed over the main surface of a semiconductor substrate,
 an element isolation trench which lies between the element formation regions and has an element isolation insulating film busied in the trench, and a gate insulating film formed in the element formation regions, wherein:

the element isolation trench has a thermal oxide film formed between the semiconductor substrate and the element isolation insulating film, and the element isolation insulating film is equipped with a large number of micro-pores inside thereof and is more porous than the thermal oxide film.

2. The semiconductor device according to claim 1, wherein the element isolation insulating film has a Young's modulus smaller than 70 GPa after heating to the highest temperature among heating temperatures for the formation of the semiconductor device.

3. The semiconductor device according to claim 1, wherein a plurality of interlayer insulating films have a porous interlayer insulating film formed so that a difference in average micro-pore diameter between the interlayer insulating film and the element isolation insulating film becomes smaller than a difference in average micro-pore diameter between the element isolation insulating film and the thermal oxide film.

4. A semiconductor device comprising:

a plurality of element formation regions formed over the main surface of a semiconductor substrate, an element isolation trench which lies between the element formation regions and has an element isolation insulating film buried in the trench, and a gate insulating film formed in the element formation regions, wherein:

the element isolation trench has a thermal oxide film between the element isolation insulating film and the surface of the semiconductor substrate, a nitride film thinner than the thermal oxide film is formed or not formed between the element isolation insulating film and the thermal oxide film, and the element isolation insulating film is equipped with a porous film which has, inside thereof, a large number of micro-pores and in which the number of micro-pores with a pore diameter of 5 nm or less exceeds that of micro-pores with a pore diameter of 10 nm or greater after heating to the highest temperature among heating temperatures for the formation of the semiconductor device.

5. The semiconductor device according to claim 4, wherein the element isolation insulating film has a Young's modulus smaller than 70 GPa after heating to the highest temperature among heating temperatures for the formation of the semiconductor device.

6. A semiconductor device comprising:

a plurality of element formation regions formed over the main surface of a semiconductor substrate, an element isolation trench which lies between the element formation regions and has an element isolation insulating film buried in the trench, and a gate insulating film formed in the element formation regions, wherein:

the element isolation trench has a thermal oxide film formed between the semiconductor substrate and the element isolation insulating film, and the element isolation insulating film has a Young's modulus lower than tat of the thermal oxide film.

7. The semiconductor device according to claim 6, wherein the element isolation insulating film in the element isolation trench is equipped with a porous film in which the number of micro-pores with a pore diameter of 5 nm or less exceeds that of micro-pores with a pore diameter of 10 nm or greater after heating to the highest temperature among heating temperatures for the formation of the semiconductor device and has a Young's modulus smaller than 70 GPa.

8. A semiconductor device according to claim 6, wherein the element isolation insulating film in the element isolation french is equipped with a porous film, the average micro-pore diameter of the porous film falls within a range of 1 nm or greater and less than 1.3 run alter beating to the highest temperature among heating temperatures for the formation of the semiconductor device and the Young's modulus of the porous film is smaller than 70 Gpa.

9. A semiconductor device comprising:

a plurality of element formation regions formed over the main surface of a semiconductor substrate, an element isolation trench which lies between the element formation regions and has an element isolation insulating film buried in the trench, and a gate insulating film, a gate electrode and a plurality of interconnect layers formed thereabove, each formed in the element formation regions, wherein:

the element isolation insulating film has a first element isolation insulating film deposited over the element isolation trench having a thermal oxide film formed over the surface of the substrate, and a second element isolation insulating film deposited over the first element isolation insulating film, and the first element isolation Insulating film is porous and more porous than the second element isolation insulating film.

10. The semiconductor device according to claim 9, wherein:

the element isolation french has a thermal oxide film formed between the semiconductor substrate and the first element isolation insulating film, and the first element isolation insulating film is more porous than the thermal oxide film.

11. The semiconductor device according to claim 9, wherein:

the element isolation trench has a thermal oxide film formed between the semiconductor substrate and the element isolation insulating film, and the first element isolation insulating film has a Young's modulus lower than that of the thermal oxide film.

12. The semiconductor device according to claim 9, wherein:

the element formation region includes an impurity region obtained by implanting an impurity into the semiconductor substrate relative to the gate electrode, and interfaces of the second element isolation insulating film on the side of an interlayer insulating film and on the side of the first element isolation insulating film exist in a region deeper than the depth which is below the surface of the substrate in the impurity region and at which an impurity concentration becomes highest.

13. The semiconductor device according to any of claims 1, 4, 2, 6, 7, or 8, wherein:

the element formation region includes an impurity region obtained by implanting an impurity into the semiconductor substrate relative to the gate electrode; and an interface of the element isolation insulating film on the side of an interlayer insulating film exists in a region deeper than the depth which is below the surface of the substrate in the impurity region and at which an impurity concentration becomes highest.

14. The semiconductor device according to any of claims 1, 4, 2, 6, 7, 9, 10, 11, 12, or 5, wherein the element isolation insulating film is equipped with an insulating film which has SiO as a main component thereof and is available by heating a coating film having a hydrogen silsesquioxane compound as a main component thereof.

15. The semiconductor device according to any of claims 1, 4, 2, 6, 7, 9, 10, 11, 12, or 5, wherein the element isolation insulating film is equipped with an insulating film which has SiO as a main component thereof and is available by heating a coating film having a methyl silsesquioxane compound as a main component thereof.

* * * * *